(12) United States Patent
Mattes et al.

(10) Patent No.: US 6,821,342 B2
(45) Date of Patent: Nov. 23, 2004

(54) METHOD FOR FORMING SUSPENDED MICROSTRUCTURES

(75) Inventors: Michael F. Mattes, Chandler, AZ (US); Ralph B. Danzl, Tempe, AZ (US)

(73) Assignee: Medtronic, Inc., Minneapolis, MN (US)

( * ) Notice: Subject to any disclaimer, the term of this patent is extended or adjusted under 35 U.S.C. 154(b) by 100 days.

(21) Appl. No.: 10/278,471

(22) Filed: Oct. 23, 2002

(65) Prior Publication Data

US 2004/0079277 A1 Apr. 29, 2004

(51) Int. Cl.$^7$ .......................... C30B 25/02; C30B 25/04
(52) U.S. Cl. ............................ 117/89; 117/84; 117/94
(58) Field of Search .............................. 117/84, 89, 94

(56) References Cited

U.S. PATENT DOCUMENTS

| | | |
|---|---|---|
| 4,601,779 A | 7/1986 | Abernathey et al. |
| 5,374,564 A | 12/1994 | Bruel |
| 6,225,190 B1 | 5/2001 | Bruel et al. |

OTHER PUBLICATIONS

"Fabrication of Silicon and Oxide Membranes Over Cavities Using Ion–Cut Layer Transfer", Chang–Han and Nathan W. Cheung, Journal of Microelectromechanical Systems, vol. 9, No. 4, p. 474–477, (Dec. 2000).

"Fundamentals of Microfabrication", Marc J. Madou, p, 249–250, (1997).

"A Lower Bound On Implant Density To Induce Wafer Splitting In Forming Compliant Substrate Structures," L. B. Freund, Applied Physics Letter, vol. 70, No. 26, p. 3519–3521, (Jun. 1997).

"The History, Physics, and Applications of the Smart–Cut® Process," Michel Bruel, MRS Bulletin, p. 35–39, (Dec. 1998).

"A 'Smarter–cut' approach to low temperature silicon layer transfer", Q.Y. Tong et al, Applied Physics Letter, vol. 72, No. 1, p–49–51, (Jan. 1998).

*Primary Examiner*—Felisa Hiteshew
(74) *Attorney, Agent, or Firm*—Michael C. Soldner; Girma Wolde-Michael

(57) ABSTRACT

A method for forming a suspended microstructure is provided. The method includes providing a monocrystalline target substrate and subjecting the surface of the monocrystalline target substrate to ion implantation to form a microstructure layer at the surface of the monocrystalline target substrate. An epitaxial material layer is formed overlying the microstructure layer. A handle substrate is provided and a patterned interposed material layer is provided between the epitaxial material layer and the handle substrate. The epitaxial material layer, the patterned interposed material layer and the handle substrate are affixed. The method further includes thermally treating the monocrystalline target substrate to effect separation between the microstructure layer and a remainder of the monocrystalline target substrate.

20 Claims, 4 Drawing Sheets

METHOD FOR FORMING SUSPENDED MICROSTRUCTURES

FIELD OF THE INVENTION

This invention relates generally to a method for forming suspended microstructures and more specifically to a method for forming suspended microstructures using ion implantation.

BACKGROUND OF THE INVENTION

Semiconductor devices continue to shrink in size while growing exponentially in function. One class of small-scale semiconductor devices is microelectromechanical systems (MEMS), which are gaining ever-growing popularity in the microelectronics industry. MEMS are semiconductor device systems that include one or more microstructures, that is, structures of the size on the order of sub-µm to millimeters. MEMS systems typically are fabricated using micromachining technology that includes a number of intricate, and often costly, processing and fabrication steps that are conducted on a very small, microscopic scale.

A variety of MEMS devices, such as microbeams, membranes, capacitive-type sensors, microhinges, and microvalves, utilize or are fabricated from suspended microstructures. Such suspended microstructures are typically formed using micromachining technology that includes grinding and polishing processes or wet chemical etching processes. However, grinding and polishing processes may be prone to wafer breakage and may result in microstructures having non-uniform thicknesses over the cavities from which they are suspended. Wet chemical etching processes may be time consuming, thus increasing production costs and reducing throughput, and may leave an etch stop layer behind. The etch stop layer may not be desirable and may need to be removed by a non-selective etch.

Accordingly, a need exists for a method for forming suspended microstructures from a monocrystalline substrate using ion implantation.

BRIEF DESCRIPTION OF THE DRAWINGS

The present invention is illustrated by way of example and not limitation in the accompanying figures, in which like references indicate similar elements, and in which.

Figure 3:
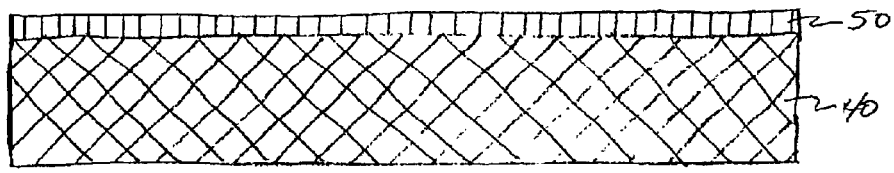
FIGS. 1–6 illustrate schematically, in cross section, the formation of a suspended microstructure in accordance with an exemplary embodiment of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

SUMMARY OF THE INVENTION

This summary of the invention section is intended to introduce the reader to aspects of the invention and may not be a complete description of the invention. Particular aspects of the invention are pointed out in other sections herein below, and the invention is set forth in the appended claims which alone demarcate its scope.

In accordance with an exemplary embodiment of the present invention, a method for forming a suspended microstructure is provided. The method includes providing a monocrystalline target substrate and subjecting the surface of the monocrystalline target substrate to ion implantation to form a microstructure layer at the surface of the monocrystalline target substrate. An epitaxial material layer is formed overlying the microstructure layer. A handle substrate is provided and a patterned interposed material layer is provided between the epitaxial material layer and the handle substrate. The epitaxial material layer, the patterned interposed material layer and the handle substrate are affixed. The method further includes thermally treating the monocrystalline target substrate to effect separation between the microstructure layer and a remainder of the monocrystalline target substrate.

In accordance with another exemplary embodiment of the present invention, a method of forming a suspended microstructure is provided in which a monocrystalline target substrate is provided and a screening layer is formed overlying the monocrystalline target substrate. A surface of the monocrystalline target substrate is subjected to ion implantation to form a microstructure layer at the surface of the monocrystalline target substrate. The screening layer is removed. A handle substrate is coupled to the monocrystalline target substrate and a patterned material layer is interposed between the microstructure layer and the handle substrate. The microstructure layer, patterned material layer and handle substrate are affixed. The monocrystalline target substrate is thermally treated to effect separation between the microstructure layer and a remainder of the monocrystalline target substrate. An epitaxial material layer is then formed overlying the microstructure layer.

DETAILED DESCRIPTION OF THE INVENTION

The following description is of exemplary embodiments only and is not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
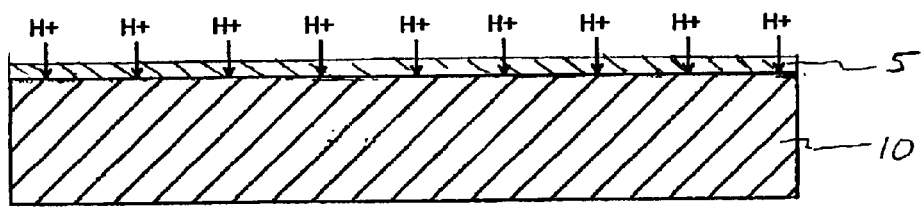

FIGS. 1–6 illustrate a process in accordance with one exemplary embodiment of the invention for forming a suspended microstructure from a monocrystalline substrate using ion implantation. Referring to FIG. 1, a monocrystalline target substrate 10 is provided. In this context, the term "monocrystalline" shall have the meaning commonly used within the semiconductor industry and shall refer to materials that are a single crystal or that are substantially a single crystal, such as silicon or germanium or mixtures of silicon or germanium. Target substrate 10 may be either n-type or p-type. In a preferred embodiment of the present invention, target substrate 10 is formed from silicon.

In one exemplary embodiment of the present invention, a screening, or sacrificial, layer 5 may be deposited overlying target substrate 10. Screening layer 5 may have a thickness of about 1–300 angstroms. Screening layer 5 may serve to reduce or prevent damage to the surface of target substrate 10 during ion implantation, which is discussed in more detail below. Preferably, screening layer 5 is formed of a silicon oxide.

Figure 2:
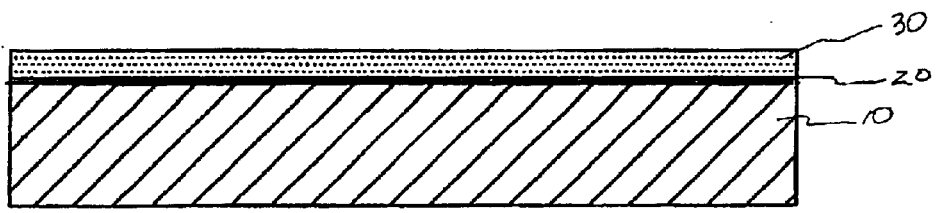

Target substrate 10 then is subjected to an ion implantation of H+ ions (protons) at a given dose and energy to achieve implantation to a desired penetration depth, as illustrated in FIG. 2. The penetration depth will determine the thickness of, a microstructure layer 20, a portion of which will eventually comprise a suspended microstructure. In one exemplary embodiment of the present invention, the implantation of H+ ions may be conducted with a dose ranging from about $1 \cdot 10^{16}$ cm−2 to about $7 \cdot 10^{16}$ cm−2 and an energy ranging from about 40 keV to about 80 keV. In a preferred embodiment of the invention, ion implantation is performed with a dose of about $4 \cdot 10^{16}$ cm−2 and an energy of about 80 keV. The thickness of microstructure layer 20 typically is in the range of about 0.01 to about 1.6 μm.

After ion implantation, screening layer 5 previously formed overlying target substrate 10 now may be removed. Screening layer may be removed by a wet etch, such as in buffered hydrofluoric acid or any other suitable fluid, a dry etch, as in plasma, or by any other suitable method.

As further illustrated in FIG. 2, an epitaxial material layer 30 may then be formed overlying target substrate 10 and grown to any thickness suitable to form a suspended microstructure for a desired application. In one exemplary embodiment of the present invention, epitaxial material layer 30 may be formed overlying target substrate 10 by subjecting target substrate 10 to a temperature in the range of about 900° C. to about 1200° C. for about 5 minutes to about 30 minutes while exposing target substrate 10 to a source of the epitaxial material. In a preferred embodiment of the invention, target substrate 10 is subjected to a temperature of about 1100° C. for about 10 minutes while exposing target substrate 10 to a source of silane to form a silicon epitaxial material layer 30.

It may be appreciated that the process for forming epitaxial material layer 30 may be conducted at temperatures and for durations that may cause H+ ions to diffuse or escape from target substrate 10. If a significant amount of H+ ions diffuse from target substrate 10 during formation of epitaxial material layer 30, separation of microstructure layer 20 from target substrate 10, as discussed in more detail below, will not occur. To obtain adequate separation of microstructure layer 20 from target substrate 10, a satisfactory balance between the parameters for formation of epitaxial material layer 30 and the energies and doses for ion implantation should be realized. Thus, it is preferable to conduct ion implantation at sufficient doses and energies such that, if such diffusion does occur during growth of epitaxial material layer 30, it has no significant impact on the formation of microstructure layer 20 at the surface of target substrate 10 and the later separation of microstructure layer 20 from target substrate 10. It is believed that the ion implantation doses and energies set forth above meet this specification for the above-defined parameters for growth of epitaxial material layer 30.

Figure 4:
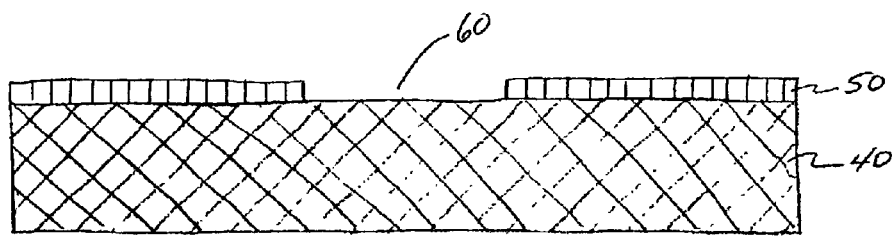

Referring now to FIG. 3, a handle substrate 40 is provided. An interposed material layer 50 may be formed overlying handle substrate 40. Interposed material layer 50 may comprise a silicon dioxide film, a silicon nitride film, a metal film, or any dielectric material that is suitable for forming a suspended microstructure for a desired application. Interposed material layer 50 may be grown to any thickness suitable for separating handle substrate 40 and target substrate 10 as appropriate for a desired application. Referring to FIG. 4, interposed material layer 50 then may be patterned using standard semiconductor photolithography techniques to create cavity 60, and any additional cavities, to be used to form one or more subsequently-formed suspended microstructures. Cavity 60, and any additional cavities, may be of any shape and size suitable for a desired application.

Figure 5:
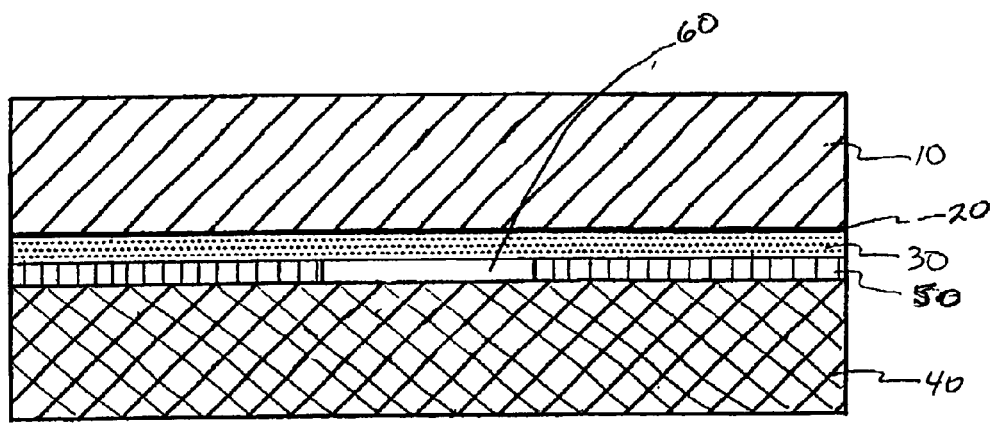

Turning now to FIG. 5, handle substrate 40 may be coupled to target substrate 10 by affixing epitaxial material layer 30 and interposed material layer 50 together. As used herein, the term "couple" is used in its broadest sense and means that handle substrate 40 is combined with and/or used with target substrate 10 to facilitate forming a suspended microstructure. In one exemplary embodiment of the invention, epitaxial material layer 30 may be affixed to interposed material layer 50 by fusion bonding epitaxial material layer 30 to interposed material layer 50. Methods for fusion bonding are well known. An example of a fusion bonding technique is described in Madou, Fundamentals of Microfabrication, pp. 249–250 (CRC Press 1997), the entirety of which is herein incorporated by reference. It will be appreciated, however, that electrostatic bonding or any other suitable method for affixing the layers may be used without deviating from the principles of the present invention.

Figure 6:
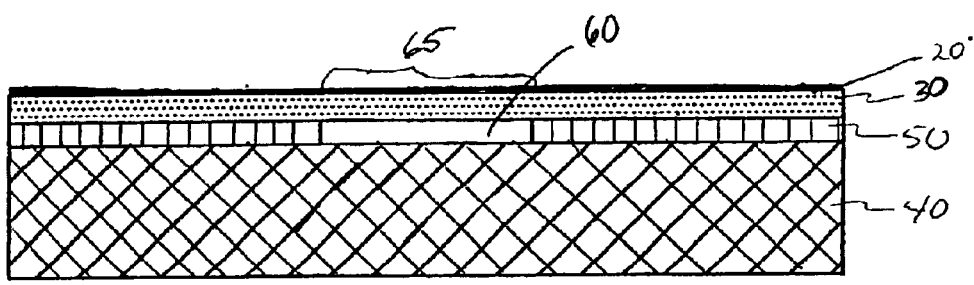

Referring to FIG. 6, target substrate 10 then may be thermally treated to induce microstructure layer 20 to separate or cleave from a remainder of target substrate 10 (not shown), thus forming a suspended microstructure 65 above cavity 60. In one exemplary embodiment of the invention, target substrate 10 may be subjected to a thermal anneal of about 400–600° C. for about 15 minutes to one hour in nitrogen gas. In a preferred embodiment of the present invention, target substrate 10 is subjected to a thermal anneal of about 500° C. for about 30 minutes in nitrogen gas. In an optional embodiment of the present invention, substrate 10 may be first subjected to a low temperature thermal anneal of about 200–300° C. for about 30 minutes to one hour in ambient environment, followed by a thermal anneal of about 500° C. for about 30 minutes in nitrogen gas. Without being limited to any particular theory, it is believed that when hydrogen ions are implanted in a monocrystalline substrate having a (100) lattice at doses and energies within the ranges given above, the hydrogen ions start to form bubbles that are distributed about a plane at the penetration depth that is parallel to the substrate surface. Upon thermal treatment, the bubbles coalesce, inducing a relatively defect-free cleaving between the layer of substrate through which ion implantation was conducted and the remainder of the substrate. Such a process may produce suspended microstructure 65, which may have a high-quality single crystal lattice like the single crystal lattice of target substrate 10.

While interposed material layer 50 is illustrated in FIGS. 3 and 4 as being formed overlying handle wafer 40 and patterned before being affixed to epitaxial material layer 30, it may be appreciated that, in an alternative embodiment of the invention, interposed material layer 50 may be formed overlying epitaxial material layer 30 and then patterned. In this manner, upon affixing interposed material layer 50 and handle substrate 40, the structure illustrated in FIG. 5 may be achieved. Thermal treatment may then be conducted to obtain the structure illustrated in FIG. 6.

FIGS. 7–10 illustrate a process in accordance with another exemplary embodiment of the invention for forming a suspended microstructure from a monocrystalline substrate using ion implantation. In this exemplary embodiment of the invention, the procedures described above with reference to FIGS. 3–4 for forming patterned interposed material layer 50 overlying handle substrate 40 may be performed.

Figure 7:
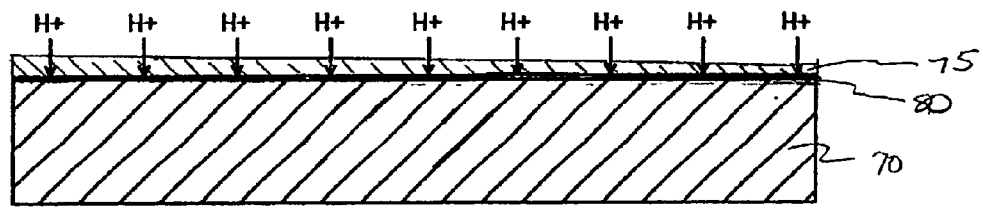
FIGS. 7–10 illustrate schematically, in cross section, the formation of a suspended microstructure in accordance with another exemplary embodiment of the invention.

Referring to FIG. 7, a monocrystalline target substrate 70 is provided. Target substrate 70 may comprise any of the materials that comprise target substrate 10 described above with reference to FIG. 1. In a preferred embodiment of the present invention, target substrate 70 is formed from silicon.

In one exemplary embodiment of the present invention, a screening layer 75 may be deposited overlying target substrate 70. As described above, screening layer 75 may have a thickness of about 1–300 angstroms. In a preferred embodiment of the invention, screening layer 75 may be formed of silicon dioxide.

Target substrate 70 then may be subjected to an ion implantation of H+ ions at a given dose and energy to effect implantation to a desired penetration depth. The penetration depth may determine the thickness of a microstructure layer 80 that is being fabricated by the ion implantation. The implantation of the H+ ions may be conducted at the doses and energies described above with reference to FIGS. 1 and 2. The thickness of microstructure layer 80 typically is in the range of about 0.01 to about 1.6 $\mu$m.

After ion implantation, screening layer 75 previously formed overlying target substrate 70 may now be removed by any suitable method, as previously described.

Figure 8:
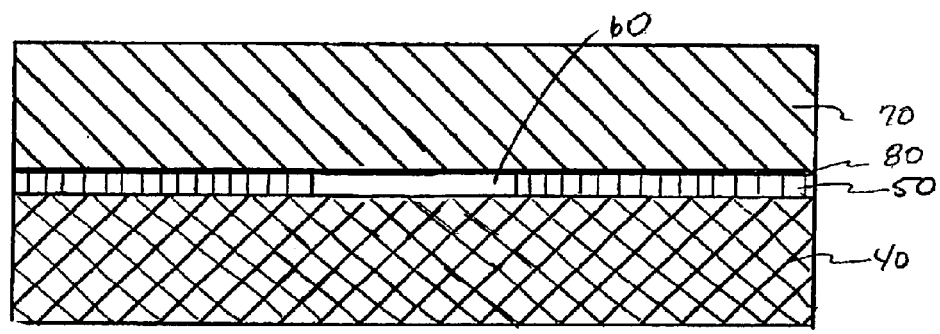

Turning now to FIG. 8, target substrate 70 then may be coupled to handle substrate 40 and interposed material layer 50 may be affixed to microstructure layer 80. Interposed material layer 50 may be affixed to microstructure layer 80 by fusion bonding, electrostatic bonding or any other suitable method for affixing interposed material layer 50 to microstructure layer 80.

Figure 9:
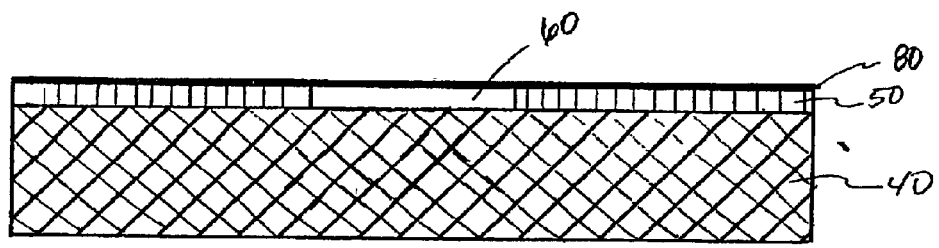

Referring to FIG. 9, target substrate 70 is then thermally treated to induce microstructure layer 80 to separate or cleave from a remainder of target substrate 70 (not shown). The thermal treatment described above with reference to FIG. 6 may be used to cleave microstructure layer 80 from target substrate 70. Again, microstructure layer 80, formed from target substrate 70, has the same single crystal lattice as that of target substrate 70.

Figure 10:
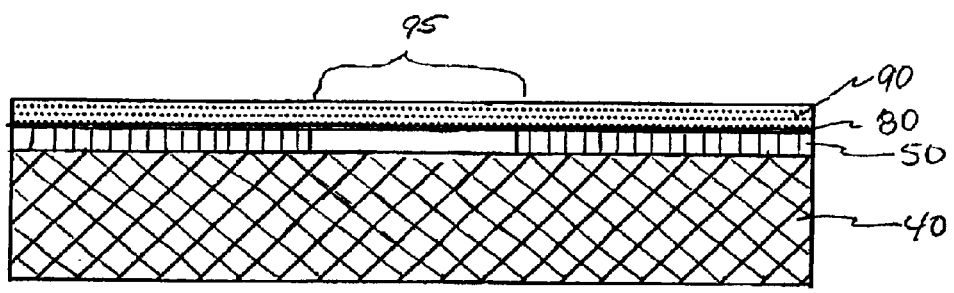

Referring to FIG. 10, an epitaxial material layer 90 then may be formed overlying microstructure layer 80 to form suspended microstructure 95. It will be appreciated that suspended microstructure 95 may be grown to any thickness suitable for a desired application while maintaining a high-quality single crystal lattice like the single crystal lattice of target substrate 70. The procedures described above for growing epitaxial material layer 30 with reference to FIG. 2 may be used to form epitaxial material layer 90. By growing the epitaxial material layer 90 after microstructure layer 80 is formed and cleaved from target substrate 70, challenges associated with H+ ions diffusing and escaping during epitaxial growth, as described above, are not-present.

While interposed material layer 50 is illustrated in FIGS. 3 and 4 as being formed overlying handle wafer 40 and patterned before being affixed to microstructure layer 80, it may be appreciated that, in an alternative embodiment of the invention, interposed material layer 50 may be formed overlying microstructure layer 80 and patterned. In this manner, upon affixing interposed material layer 50 and handle substrate 40, the structure illustrated in FIG. 8 may be achieved. Thermal treatment may then be conducted to obtain the structure illustrated in FIG. 9.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all-such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a suspended microstructure, the method comprising:

providing a monocrystalline target substrate;

subjecting a surface of said monocrystalline target substrate to ion implantation to form a microstructure layer at said surface of said monocrystalline target substrate;

forming an epitaxial material layer overlying said microstructure layer;

providing a handle substrate;

providing a patterned interposed material layer between said epitaxial material layer and said handle substrate;

affixing said epitaxial material layer, said patterned interposed material layer, and said handle substrate; and thermally treating said monocrystalline target substrate to effect separation between said microstructure layer and a remainder of said monocrystalline target substrate.

2. The method of claim 1, further comprising forming a screening layer overlying said monocrystalline target substrate prior to said subjecting.

3. The method of claim 2, further comprising removing said screening layer after said subjecting.

4. The method of claim 1, said subjecting comprising subjecting said surface of said monocrystalline target substrate to ion implantation at an ion dose of from about $1 \cdot 10^{16}$ cm$^{-2}$ to about $7 \cdot 10^{16}$ cm$^{-2}$.

5. The method of claim 1, said subjecting comprising subjecting said surface of said monocrystalline target substrate to ion implantation at an energy of from about 40 keV to about 80 keV.

6. The method of claim 1, said providing a patterned interposed layer comprising forming said patterned interposed material layer overlying said handle wafer.

7. The method of claim 6, said affixing comprising fusion bonding said patterned interposed material layer and said epitaxial material layer.

8. The method of claim 1, said providing a patterned interposed layer comprising forming said patterned interposed material layer overlying said epitaxial material layer.

9. The method of claim 8, said affixing comprising fusion bonding said patterned material layer and said handle substrate.

10. The method of claim 1, said thermally treating comprising subjecting said monocrystalline target substrate to a temperature in the range of about 400° C. to about 600° C. for about 15 minutes to about one hour.

11. The method of claim 1, wherein said epitaxial material layer is formed at a temperature in the range of from about 900° C. to about 1200° C.

12. A method for forming a suspended microstructure, the method comprising:

providing a monocrystalline target substrate;

forming a screening layer overlying said monocrystalline target substrate;

subjecting a surface of said monocrystalline target substrate to ion implantation to form a microstructure layer at said surface of said monocrystalline target substrate;

removing said screening layer from said monocrystalline target substrate;

coupling a handle substrate to said monocrystalline target substrate;

interposing a patterned material layer between said microstructure layer and said handle substrate;

affixing said microstructure layer, said patterned material layer, and said handle substrate;

thermally treating said monocrystalline target substrate to effect separation between said microstructure layer and a remainder of said monocrystalline target substrate; and forming an epitaxial material layer overlying said microstructure layer.

13. The method of claim 12, said subjecting comprising subjecting said surface of said monocrystalline target substrate to ion implantation at an ion dose of from about $1 \cdot 10^{16}$ cm$^{-2}$ to about $7 \cdot 10^{16}$ cm$^{-2}$.

14. The method of claim 12, said subjecting comprising subjecting said monocrystalline target substrate to ion implantation at an energy of from about 40 keV to about 80 keV.

15. The method of claim 12, said interposing comprising forming said patterned material layer overlying said handle wafer.

16. The method of claim 15, said affixing comprising fusion bonding said patterned material layer and said microstructure layer.

17. The method of claim 12, said interposing comprising forming said patterned material layer overlying said microstructure layer.

18. The method of claim 17, said affixing comprising fusion bonding said patterned material layer and said handle substrate.

19. The method of claim 12, said thermally treating comprising subjecting said monocrystalline target substrate to a temperature in the range of about 400° C. to about 600° C. for about 15 minutes to about one hour.

20. The method of claim 12, wherein said epitaxial material layer is formed at a temperature in the range from about 900° C. to about 1200° C.

* * * * *